United States Patent
Adams et al.

[19]

[11] Patent Number: 6,132,586
[45] Date of Patent: Oct. 17, 2000

[54] METHOD AND APPARATUS FOR NON-CONTACT METAL PLATING OF SEMICONDUCTOR WAFERS USING A BIPOLAR ELECTRODE ASSEMBLY

[75] Inventors: John A. Adams, Escondido; Gerald A. Krulik, San Clemente; Everett D. Smith, Escondido, all of Calif.

[73] Assignee: Integrated Process Equipment Corporation, Phoenix, Ariz.

[21] Appl. No.: 09/096,220

[22] Filed: Jun. 11, 1998

[51] Int. Cl.[7] .................................................. C25D 5/02
[52] U.S. Cl. ...................... 205/123; 205/137; 205/147; 205/148; 205/87
[58] Field of Search .............. 205/123, 87, 137, 205/148, 147

[56] References Cited

U.S. PATENT DOCUMENTS

| | | | |
|---|---|---|---|
| 4,153,531 | 5/1979 | Faul et al. | 204/263 |
| 4,430,167 | 2/1984 | Inoue | 204/25 |
| 5,096,550 | 3/1992 | Mayer et al. | 204/129.1 |
| 5,209,833 | 5/1993 | Foell et al. | 205/123 |
| 5,256,565 | 10/1993 | Bernhardt et al. | 437/228 |
| 5,344,539 | 9/1994 | Shinogi et al. | 204/224 M |
| 5,447,615 | 9/1995 | Ishida | 204/224 |
| 5,486,282 | 1/1996 | Datta et al. | 205/123 |
| 5,531,874 | 7/1996 | Brophy et al. | 204/224 |
| 5,536,388 | 7/1996 | Dinan et al. | 205/670 |
| 5,543,032 | 8/1996 | Datta et al. | 205/670 |
| 5,567,300 | 10/1996 | Datta et al. | 205/652 |
| 5,567,304 | 10/1996 | Datta et al. | 205/666 |
| 5,575,706 | 11/1996 | Tsai et al. | 451/41 |
| 5,591,671 | 1/1997 | Kim et al. | 437/190 |
| 5,660,706 | 8/1997 | Zhao et al. | 205/123 |
| 5,695,810 | 12/1997 | Dubin et al. | 427/96 |

FOREIGN PATENT DOCUMENTS

| | | |
|---|---|---|
| 0699782A1 | 3/1996 | European Pat. Off. . |
| 6-297245 | 10/1994 | Japan . |

OTHER PUBLICATIONS

A.F. Bernhardt, et al., "Electrochemical Planarization for Multi–Level Metallization of Microcircuitry," *Circuitree* pp. 41–46, Oct. 1995.

R.J. Contolini, et al., "Electrochemical Planarization for MultiLevel Metallization," *J. Electrochem. Soc.* 141 (9) :2503–2510, Sep.1994.

M.J. DeSilva and Y.S. Diamand, "A Novel Seed Layer Scheme to Protect Catalytic Surface for Eletroless Deposition," *J. Electrochem. Soc.* 143 (11) :3512–3516, Nov. 1996.

J.W. Dini, "Brush Plating: Recent Property Data," *Metal Finishing* pp. 89–93, Jun. 1997.

V.M. Dubin and Y.S. Diamand, "Selective and Blanket Electroless Copper Deposition for Ultralarge Scale Integration," *J. Electrochem. Soc.* 144(3):898–908, Mar. 1997.

C.W. Kaanta, et al., "Dual Damascene: A ULSI Wiring Technology," VMIC Conference, pp. 144–152, Jun. 1991.

J.G. Ryan, et al., "The Evolution of Interconnection Technology at IBM," *IBM J. Res. & Dev.* 39(4):1–9,, 1995, (no month available).

P. Singer, "Wafer Processing,"*Semiconductor International* pp. 40, Aug. 1997.

P. Singer, "Making the Move to Dual Damascene Processing," *Semiconductor International* pp. 79–81, Aug. 1997.

*Primary Examiner*—Kishor Mayekar
*Attorney, Agent, or Firm*—Quarles & Brady LLP

[57] ABSTRACT

Plating of metal interconnections in semiconductor wafer manufacturing is performed by providing relative motion between a bipolar electrode assembly a single metallized surface of a semiconductor wafer without necessary physical contact with the wafer or direct electrical connection thereto.

26 Claims, 7 Drawing Sheets

6,132,586

METHOD AND APPARATUS FOR NON-CONTACT METAL PLATING OF SEMICONDUCTOR WAFERS USING A BIPOLAR ELECTRODE ASSEMBLY

CROSS-REFERENCE TO RELATED APPLICATIONS

BACKGROUND OF THE INVENTION

The present invention relates to the electrochemical metal plating of integrated circuit wafers to form multilevel integrated circuit structures.

Today's semiconductor industry is beginning to adopt a manufacturing process called "damascene" for forming interconnect lines and vias for multi-layer metal structures that provide the "wiring" of an integrated circuit. The damascene technique involves etching a trench in a planar dielectric (insulator) layer and filling the trench with a metal such as aluminum, copper, or tungsten. A technique called "dual-damascene" adds etched vias for providing contact to the lower level as the damascene structure is filled. There are several different ways to manufacture the damascene structure in the dielectric layer as practiced in the art and described in "Making the Move to Dual Damascene Processing", *Semiconductor International*, August 1997 hereby incorporated by reference. When copper is used as the filling, typically a layer of another material is first deposited to line the trenches and vias to prevent the migration of the copper into the dielectric layer. This migration barrier can be deposited by chemical vapor deposition (CVD), physical vapor deposition (PVD), or electroless deposition. In addition to the migration barrier, sometimes a seed layer of the plating metal and/or other metals are applied to serve as a good site for electroless or electrolytic plating.

The filling process can be accomplished by plasma deposition, sputtering, or electroless or electrolytic deposition onto a seed layer. To achieve good fill of the typical micron to sub-micron wide trenches and vias, extra metal is deposited in the process, such metal covering areas of the wafer above and outside the trenches and vias. After filling, the extra metal must be removed down to the dielectric surface while leaving the trenches and vias filled in a process called "planarization". Standard chemical mechanical planarization (CMP) can be used to provide a planarized surface and metal removal.

As an alternative to CMP, electrochemical etching (ECE), electrochemical polishing (ECP), electropolishing, or electrochemical planarization (ECP) has been used. For the purpose of this application, the terms "electrochemical polishing", "electropolishing", "planarizing" and "electrochemical planarization" will be used interchangeably as they are in literature. The end goal is to have a very flat and smooth surface, the small difference between the terms is that the polishing desires to have a very smooth surface, while planarization desires to flatten-out topology and produce a flat smooth surface. "Electrochemical etch", however, has a different purpose, that is to remove material, generally uniformly, without regard to surface flatness.

U.S. Pat. No. 5,096,550 Mayer et al., entitled "Method And Apparatus For Spatially Uniform Electropolishing And Electrolytic Etching" describes conventional electropolishing with the addition of a non-conducting chamber or cup with a hole between the anode and the cathode, the workpiece electrically attached to the anode and the cathode external to the cup and above the layer of the hole. This approach is said to minimize the flow of hydrogen bubbles to the anode workpiece surface. For semiconductor wafers, which are bulk non-conductors, it is necessary to attach the electrode (anode) directly to the metallized front surface of the wafer, thereby limiting wafer surface area that can be used for active devices.

U.S. Pat. No. 5,256,565 Bernhardt et al., entitled "Electrochemical Planarization" describes a multi-step process, teaches separate apparatus for each step, first forming trenches or vias in a dielectric layer on a semiconductor substrate, optionally followed by one or more metal seed layers, not disclosed as how to form them, followed by metal deposition using conventional electroplating or electroless plating, followed by electrochemical polishing to form substantially flat damascene structures, optionally stopping before the metallized surface becomes partially eroded away and following with ion beam milling to remove the rest of the top surface of the metal, leaving the metal in the trenches and vias.

U.S. Pat. No. 5,567,300 Datta et al., entitled "Electrochemical Metal Removal Technique For Planarization Of Surfaces" describes an electrochemical cell and a planarization method for planarization of multilayer copper interconnections in thin film modules. The electrochemical cell and method is described as providing planarization of the first electrode surface (the wafer) using a scanning parallel second electrode with an electrolytic solution combined with a resistive salt mixture, ejected through the scanning electrode surface through built in nozzles, along with the appropriate voltage supply. Again, for semiconductor wafers, which are bulk non-conductors, it is necessary to attach the electrode (anode) directly to the metallized front surface of the wafer, thereby limiting wafer surface area that can be used for active devices.

U.S. Pat. No. 5,344,539 Shinogi et al., entitled "Electrochemical Fine Processing Apparatus" describes an apparatus for electrochemically performing an adding processing and removing processing of a substance such as a metal or polymer in a solution in order to produce a structure having a high aspect ratio. The apparatus comprises a container for the electrolytic solution, a first potential between the adding electrode and the support to be plated, a second potential between a removing electrode and the support to be plated, the second potential being opposite to the first potential, and a potential means. Shinogi et al. teaches applying the two separate but opposite potentials at the same time, or by first applying the adding potential between the adding electrode and the support to be plated and then switching to the removing potential between the adding electrode and the support to be plated. Shinogi et al. is limiting in that there is a requirement for two concurrent potentials of opposite polarity, or a stepwise process whereby the addition potential is followed by the removal potential. Shinogi et al. is advantageous over the previously described U.S. Pat. Nos. 5,096,550, 5,256,565, and 5,567,300 previously described in that simultaneous addition and removal of material is possible with two separate applied potentials. However, if the Shinogi et al. apparatus were used for semiconductor wafers, which are bulk non-conductors, it would be necessary to attach a common electrode directly to the metallized front surface of the wafer, thereby limiting wafer surface area that can be used for active devices.

U.S. Pat. No. 5,531,874 Brophy et al., entitled "Electroetching Tool Using Localized Application Of Channelized Flow Of Electrolyte," U.S. Pat. No. 5,536,388 to Dinan et al., entitled "Vertical Electroetch Tool Nozzle And Method," U.S. Pat. No. 5,543,032 to Datta et al., entitled "Electroetching Method And Apparatus" and U.S. Pat. No. 5,486,282 Datta et al., entitled "Electroetching Process For Seed Layer Removal In Electrochemical Fabrication Of Wafers" all use a linear scanning method of localizing the electrochemical reaction and are optimized in slightly different ways from etching both sides of a workpiece, to vertical scanning, to a salt solution combined with an electrolyte, to a process for forming c4 bumps on a substrate, respectively. All of these methods require an electrode attachment to the metallized seed layer or metallized surface when the workpiece is a semiconductor wafer, thereby limiting wafer surface area that can be used for active devices.

U.S. Pat. No. 5,695,810 Dubin et al., entitled "Use Of Cobalt Tungsten Phosphide As A Barrier Material For Copper Metallization" describes a technique for electrolessly depositing a CoWP barrier material onto copper and electrolessly depositing copper onto a CoWP barrier material to prevent copper diffusion when forming layers and/or structures on a semiconductor wafer. This patent teaches the formation of a damascene structure on a semiconductor wafer by a combination of electroless deposition and chemical mechanical polishing. Also, the patent teaches the formulation of a via structure also using electroless deposition. This patent also discloses separate co-pending patent applications entitled "Electroless Cu Deposition On A Barrier Layer By Cu Contact Displacement For ULSI Applications;" Ser. No. 08/587,262 filed Jan. 16, 1996; "Selective Electroless Copper Deposited Interconnect Plugs For ULSI Applications," Ser. No. 08/587,264; filed Jan. 16, 1996; and "Protected Encapsulation Of Catalytic Layer For Electroless Copper Interconnect," Ser. No. 08/587,264; filed Jan. 16, 1996. Electroless deposition as taught by Dubin et al. has some advantages in forming a damascene structure onto semiconductor wafers, but it may also have disadvantages, such as the quality of the adhesion of the barrier layer to the material being plated and possible undesirable contamination of the semiconductor due to the metal catalyst used to initiate the deposition of the barrier metal. The biggest concern in the Dubin et al. process is the inherent difficulty in controlling any electroless deposition process uniformity, as compared to an electroplating process, especially for the fine features present in semiconductor manufacturing.

What is needed is a method and apparatus for electrochemical metal plating of semiconductor wafers that does not require a physical electrical connection to the surface of the semiconductor wafer.

BRIEF SUMMARY OF THE INVENTION

The present invention permits the non-contact plating of metal for interconnections on semiconductor wafers by providing relative motion between a bipolar electrode and a single metallized surface of a semiconductor wafer, the bipolar electrode holding both the anode and cathode and eliminating the need for direct electrical connection to the wafer.

Specifically, the present invention provides a method of plating a semiconductor wafer having a metallized surface by performing the steps of positioning a bipolar electrode assembly opposite the metallized surface of the semiconductor wafer, the bipolar electrode assembly having an anode and cathode adjacent to the metallized surface of the wafer and separated along an axis parallel to the metallized surface while bathing a region between the anode and cathode and metallized surface of the semiconductor wafer in an electroplating solution. Relative motion is provided between the bipolar electrode assembly and the metallized surface along the axis with the anode preceding the cathode while a voltage is applied across the anode and cathode so as to plate with metal the metallized surface of the semiconductor wafer through action of current flow between the anode and cathode.

It is thus one object of the invention to provide an apparatus and method that electrochemically plates a metal surface on a wafer as one step in forming multilevel integrated circuit structures without having to rely on mechanical electrical contacts to the wafer metal surface. By eliminating the need to attach an electrode to the metallized wafer surface, the control of the process is greatly enhanced over standard electroless plating techniques and electrode attachment defects are not incurred.

It is another object of the invention to provide a plating system employing a bipolar electrode assembly. By providing relative motion between the electrode assembly and the metallized surface, the instantaneous electrochemical process is confined to a small area on the wafer surface providing more uniform solution resistance, more uniform deposits, better plating, better localization of current, and better temperature control.

The electroplating solution may be re-circulated through a heat exchanger and across the wafer near the anode and cathode.

It is thus another object of the invention to assure that each part of the wafer surface and each wafer sees a relatively constant set of thermal and chemical conditions.

First and second electroplating solution delivery channels may be used to provide electroplating solution separately to the anode and cathode. Further, an electroplating solution removal channel may be positioned between the first and second electrodes for withdrawing electroplating solution from the wafer.

Thus it is another object of the invention to permit the optimization of the electroplating solution to the distinct environments of the anode and cathode.

The foregoing and other objects and advantages of the invention will appear from the following description. In this description, references are made to the accompanying drawings which form a part hereof, and in which there are shown by way of illustration, the preferred embodiment of the invention. Such embodiment does not necessarily represent the full scope of the invention, however, and reference must be made therefore to the claims for interpreting the scope of the invention.

BRIEF DESCRIPTION OF THE SEVERAL VIEWS OF THE DRAWINGS

FIG. 1 (c) is a figure similar to that of FIG. 1 (b) after patterning, etching trenches, and removing the photoresist;

FIG. 1 (d) is a figure similar to that of FIG. 1 (c) after a barrier metal and seed layer have been deposited;

FIG. 1 (e) is a figure similar to that of FIG. 1 (d) after a metal film has been deposited;

FIG. 1 (f) is a figure similar to that of FIG. 1(e) after the metal layer has been planarized;

DETAILED DESCRIPTION OF THE INVENTION

The Damascene Process

FIG. 1, (a through f) shows a set of cross-sections illustrating one prior art method of manufacturing a damascene structure. Kaana et al. "Dual Damascene: A ULSI wiring Technology," Ryan et al. "The Evolution Of Interconnection Technology At IBM", Peter Singer, Editor "AMD Develops Electroplated Copper Damascene Process", "Electroless Cu Deposition Simulated," and "Making the Move to Dual Damascene Processing" provide further details on the damascene process and are hereby incorporated by reference.

Figure 1A:
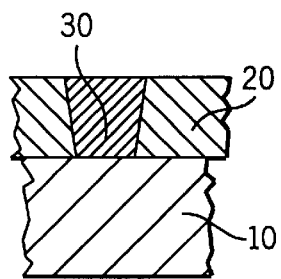
FIG. 1 (a) is a fragmentary elevational, cross-sectional view of a semiconductor wafer showing the active device layer and first inner dielectric layer that has been planarized and subsequently patterned, etched and via holes filled.
FIG. 1(b) is a figure similar to that of FIG. 1 (a) also showing a dielectric layer and a layer of photoresist.

FIG. 1(a) shows active device layer 10, with an inner layer dielectric (ILD) 20, and tungsten plugs (filled vias) 30.

Figure 1B:
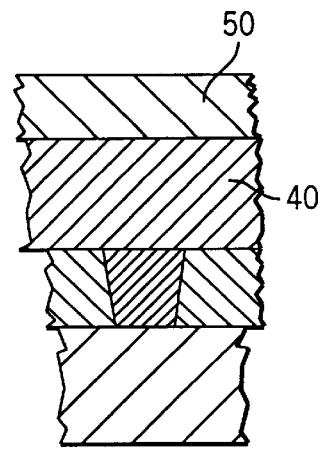
Figure 1C:
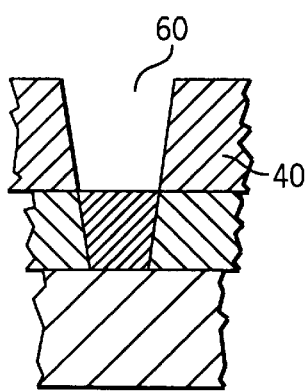

The damascene process then begins with a deposition of dielectric material 40 as shown in FIG. 1(b), and photoresist 50. The photoresist is patterned, developed, and etched, followed by etching of the dielectric layer to form the damascene trench 60 shown in FIG. 1(c).

Figure 1D:
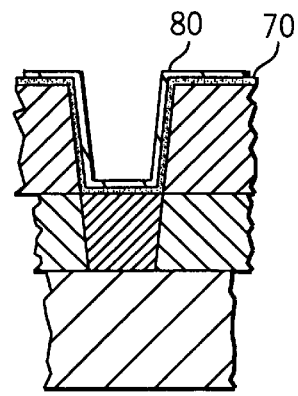

A barrier and adhesion layer 70 is deposited by CVD, PVD, or electroless, followed by the deposition of a thin seed layer 80 by similar methods as shown in FIG. 1(d). The seed layer 80 may be capped by a sacrificial metal film to provide further protection until the next process step is taken as described in DeSilva & Shacham-Diamand, "A Novel Seed Layer Scheme to Protect Catalytic Surface for Electroless Deposition."

Figure 1E:
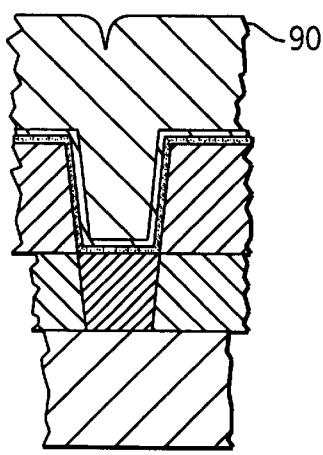

FIG. 1(e) shows a metal fill 90 of the trench. The metal could have been filled from CVD, PVD, electroless or electrolytic plating. To planarize the metal fill 90 several methods can be used; CMP, laser leveling, etching, or electrochemical planarization (electropolishing).

Figure 1F:
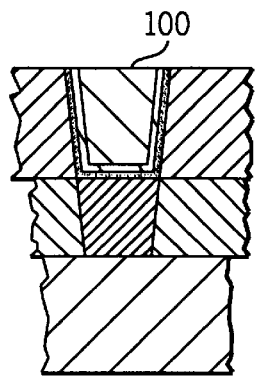

FIG. 1(f) shows the planarized surface 100.

It is important to understand that each of the methods of depositing metal into the trenches and vias and each of the methods of planarizing the metal to form the damascene process has its own set of features and characteristics well known in the art. For example, one method may fill narrow trenches better, another method may work better filling trenches if the trench walls are slightly angled wider at the top. Prior art methods of planarization of the metal surface also varies depending on the method used. Pure chemical etching of the metal produces inferior results since it tends to attack all exposed surfaces and would etch away at the depression that tends to form as a result of the filling process, as fast as the more planar metal surface. The etch would generally result in a dishing of the metal conductor.

CMP tends to work very well for planarization if the correct slurry and process parameters are used. The higher the surface feature, the faster the CMP process removes it. Electrochemical planarization is attractive since it does not require a slurry to operate and does not scratch the surface as CMP may. One skilled in the art of CMP and electrochemistry can select and choose the most appropriate method of filling and planarizing the metal surface. More details on Electrochemical planarization are given in Bernhardt et al., "Electrochemical Planarization for Multi-Level Metallization of Microcircuitry" and Contolini et al., "Electrochemical Planarization for Multi-Level Metallization."

Prior Art Electro Plating

Figure 2:
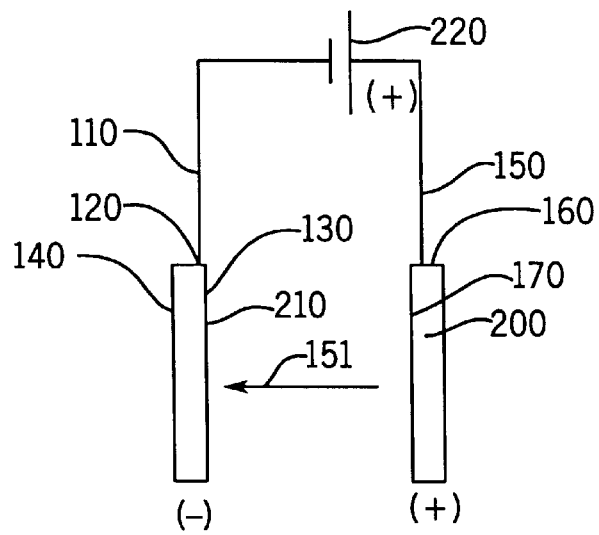
FIG. 2 is a schematic cross sectional view in elevation of a prior art electroplating cell, showing anode and cathode (plating occurs onto the cathode)

FIG. 2 shows prior art in standard electroplating. A conducting anode 200 of the metal to plate is connected to an electrical conductor 150 by attachment 160. The electrical conductor 150 is also connected to the positive terminal of a voltage source 220. The metal object to plate, a workpiece 210 is connected to an electrical conductor 110 at attachment 120. The electrical conductor 110 is also connected to the negative terminal of the voltage source 220 forming a cathode in an electrochemical cell. The anode and cathode are suspended within a tank (not shown) containing the electroplating (working) solution with the metal ions that will plate out onto the workpiece 210, since it is a cathode in the cell. One skilled in electroplating realizes that most of the plating of metals will take place on the workpiece surface 130 facing the anode. Also, most of the metal that is de-plated from the anode 200 comes from the anode surface 170 facing the workpiece 210. This behavior is governed by the electric field, represented by arrow 151, caused by applying the voltage across the electrochemical cell by voltage source 220. Since the anode 200 and the cathode 210 are suspended in a conducting or electrolytic solution, electrical current will flow from the anode 200 to the cathode 210 in the same direction as the electric field.

Figure 3:
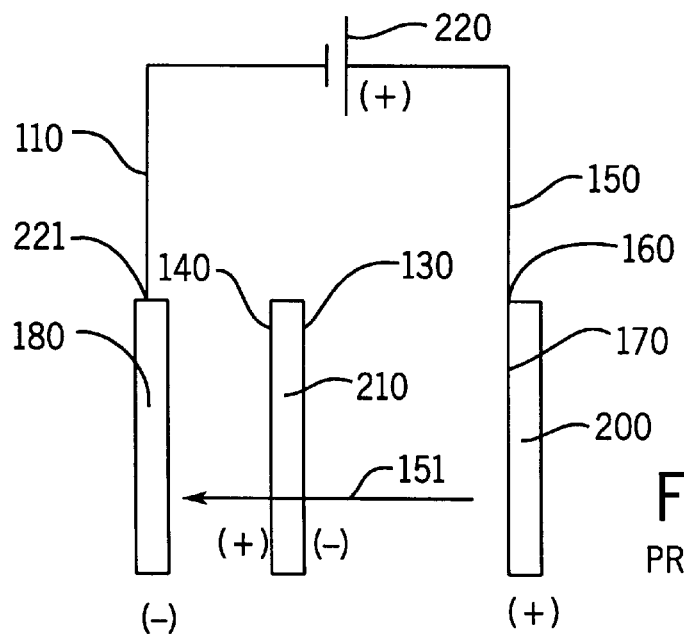
FIG. 3 is a schematic cross sectional view in elevation of a prior art bipolar electrode electroplanarization cell, showing anode, cathode, and workpiece to planarize.

As shown in FIG. 3, if one were to add an additional electrode for the cathode 180 and instead of attachment 120 in FIG. 2, connect electrical conductor 110 to the new cathode 180 at connection 221, a bipolar electroplating cell would be formed. The electric field from the anode 200 to the cathode 180 is represented by arrow 151 shown in FIG. 3. Since the anode 200, workpiece 210, and the cathode 180 are all conducting and immersed within an electrolytic solution during operation, current flows from the anode 200 through the electrolyte (not shown) to the surface 130 of the workpiece 210 and through the workpiece 210 to workpiece surface 140, and through the electrolytic solution (not shown) to the cathode 180 by action of the applied voltage source 220. In effect, the workpiece becomes bipolar in that one surface 130 is negatively charged with respect to the anode 200 while the other surface 140 is positively charged with respect to the cathode 180. Due to the fact that the surface 130 of the workpiece 210 is negative with respect to the anode 200, electroplating of metal occurs on surface 130. However, due to surface 140 being positive with respect to cathode 180, de-plating of metal may occur at surface 140. This bipolar effect allows electroplating of conducting objects without having to have a separate conductor attached to the workpiece. If only surface 130 of the workpiece 210 is conducting with surface 140 being essentially non-conducting, plating of metal on surface 130 will still take place but will be highly non-uniform, since the current flow through the cell and workpiece must flow around the non-conducting surface 140 and into the edge of the conducting surface 130. Semiconductor wafers with a metal seed layer are typically only conducting on the seed layer side and not the back side of the wafer. Therefore, contactless electroplating of the metal seed layer of semiconductor wafer workpiece in a bipolar cell will not work very well. Currently, electroplated metal seed layers on a semiconductor wafer workpiece require electrode attachments to the seed layer and are electroplated as shown in FIG. 2. Electroless plating of the metal seed layer does not require electrode attachments, however.

For electropolishing or electroplanarization, the potentials shown in FIG. 2 and FIG. 3 are reversed and many times a different electroplating solution is used.

For prior art electroplanarization of a semiconductor metal surface, electrode contacts are required on the metal surface. Conventional bipolar planarization will not work satisfactorily with semiconductor metal surfaces due to the same reasons that bipolar electroplating does not work well, the semiconductor is only metallized on the metallized surface, while its back surface is a non-conductor (typically an oxide film). The counterpart to electroless plating is chemical etching. Chemical etching of the metallized surface will not produce satisfactory planarization of the surface.

Thus, if the desired process to fill the trenches and vias is by electroplating, electrode attachments must be made to the metal layer. These attachments show up in the final metal surface as defects.

If the plating of the damascene structure did not require electrode contacts to the wafer surface, a finer and higher quality product would result. Additionally, if the requirement for two separate potentials, as practiced in U.S. Pat. No. 5,344,539, Shinogi et al., were reduced to a single potential, a simpler and more reliable system would result. The present invention accomplishes all of these goals.

Single Sided Bipolar Electroplating

Figure 4:
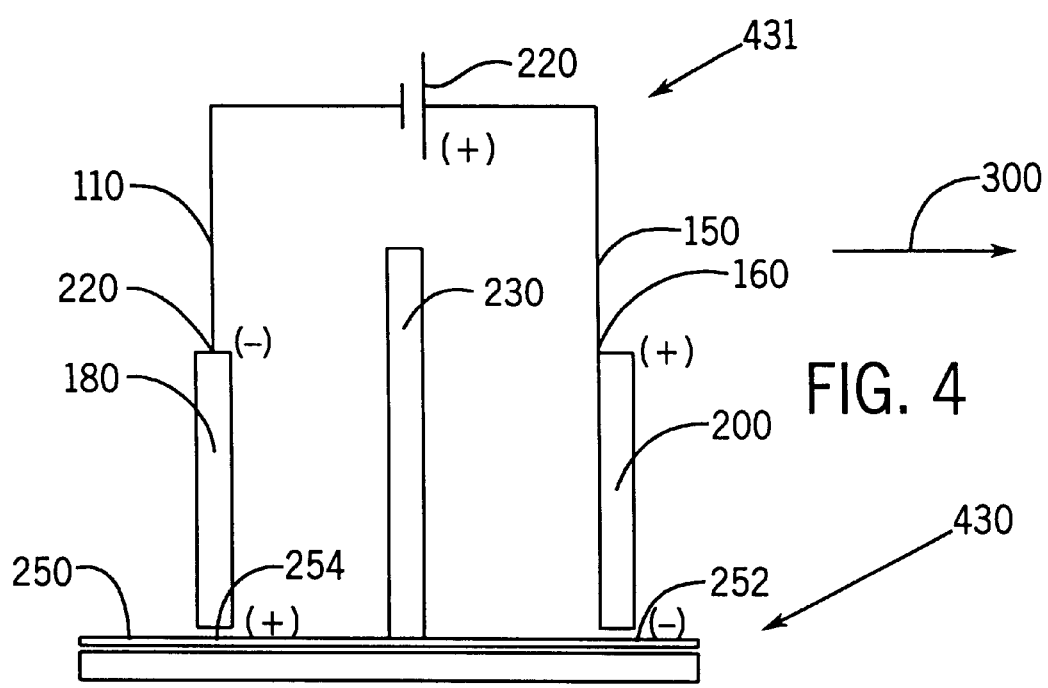
FIG. 4 is a schematic cross sectional view in elevation of a bipolar electrode electroplating cell of the present invention providing plating on a single conducting side of the workpiece.

Referring to FIG. 4, a single sided bipolar electrode 431 of the present invention provides for simultaneous plating and deplating on a single conducting side of a wafer 430. The bipolar electrode 431 includes an anode 200 and cathode 180 arranged to be positioned on the same metallized side 250 of the workpiece, plus adds an insulator block 230 placed between them. When positioned for use, the anode 200 and cathode 180 extend substantially perpendicularly from the metallized face of the wafer 430 and are spaced apart along a scanning direction 300 to be described but which is generally parallel to the metallized face of the wafer 430. The anode 200, the cathode 180 and the insulator block may have a length measured along the metallized surface of the wafer 430 perpendicular to the scanning direction 300 so as to span the widest part of the wafer 430 so that a portion of the anode 200 and the cathode 180 may be adjacent to the entire area of the metallized surface of the wafer along that span. The anode 200 and cathode 180 are positioned to closely approach the surface of the metallized surface of the wafer 430 but not to contact that surface directly.

In FIG. 4, applying a positive potential from voltage source 220 through electrical conductor 150 and connecting to anode 200 at attachment 160, while applying a negative potential through electrical conductor 110 and connection 221 to cathode 180, would result in electroplating occurring to the area 252 immediately under the anode 200 and deplating or electropolishing occurring to the area 254 immediately under the cathode 180 due to the standard bipolar electrochemical effect. This single-sided approach is utilized in the present invention.

Figure 5:
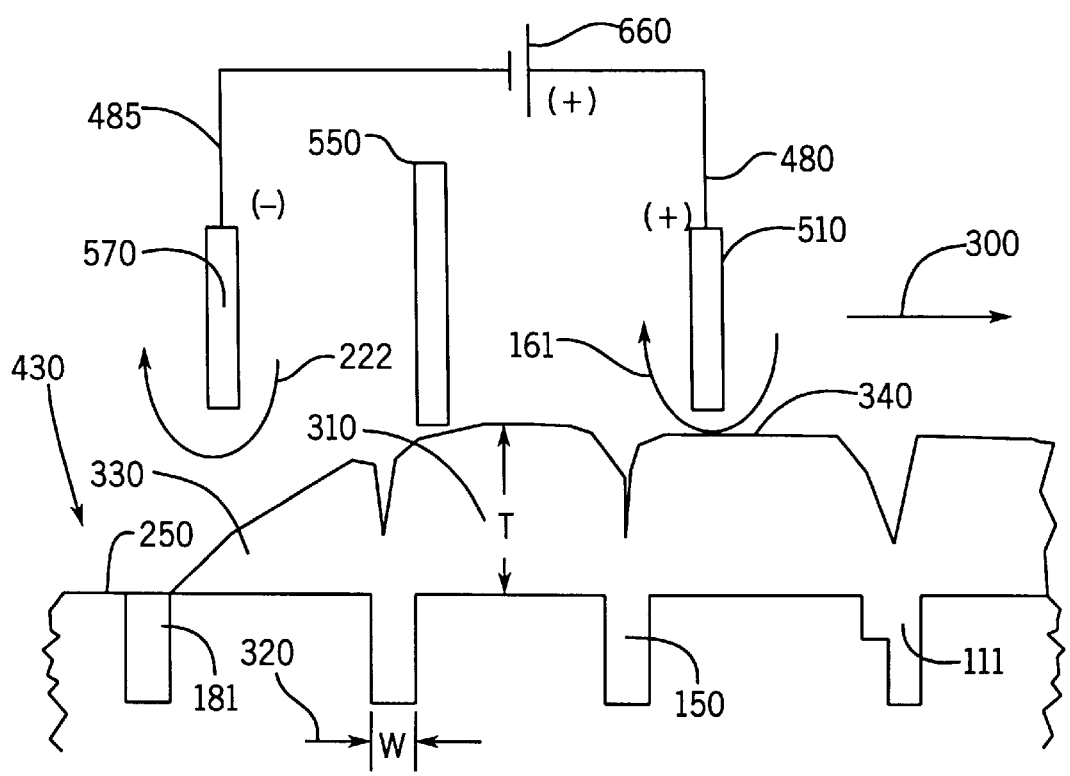
FIG. 5 is a figure similar to FIG. 4 showing the bipolar electrode of the present invention operating to plate a wafer having trenches, both exaggerated for clarity.

FIG. 5 is an elevational, cross-sectional view to illustrate the electroplating of the wafer. The distance between anode and cathode has been reduced for illustration purposes. The anode 510, cathode 570, and cathode insulated separator block 550 are caused to move relative to the wafer 430 by scanning means such as a motor driven lead screw or the like in the scanning direction 300. Electroplating solution 161 flows between the anode 510 and a part of the wafer surface in the direction indicated by the arrow. Electrolytic solution 222 flows between the cathode 570 and a different part of the wafer surface in the direction indicated by the arrowhead. The anode 510 and cathode 570 operate on the same side of the wafer, not opposite sides as in conventional bipolar plating. Individually, the anode and cathode may be of different size, shape, distance from the surface of the wafer or area to enhance or reduce the current densities under the electrodes and thereby the plating rates, respectively. The power lines 480 and 485 are connected to the anode and cathode, respectively, and provide the operating voltage and current from power unit 660. Electrical contact through the electroplating solution is made with metal 340, previously deposited onto the wafer 430 as the anode 510 moves over the metallized side 250 of the wafer 430 in the scanning direction 300.

A partially filled trench 111 is shown as the anode approaches its location. The thickness of metal 310 that needs to added in plating is approximately three (3) times as thick as the widest trench 320 is wide to ensure that the trenches are completely filled before planarization. The electroplating solution 161 is withdrawn from the wafer surface as is illustrated by the arrow. The anode/cathode insulated separator block 550 forces the current to flow into the metallized wafer surface and not just between the anode and cathode. Metal 330 is electrically contacted through the electrolyte as the cathode moves over the wafer. A trench 181 is shown fully plated after the cathode has passed its location. In this process, the thickness of metal 310 that was added by the anode 510 is left substantially behind as the cathode 570 passed over.

The spent electrolytic solution 222 is withdrawn from the wafer surface as is illustrated by the arrow. Whether the process removes any of the plated material depends on the exact compositions on the layer, the fill metal, the chemistry, the applied potential, the current, and whether or not a surface passivation chemical has been added to protect the filled trenches, as will be understood from this description, to one of ordinary skill in the art. The preferred process uniformly plates metal and then rinses and applies a passification rinse chemical that substantially passifies the surface of the filled trenches. When the electrodeposited metal fill is copper, a dilute 0.005 Molar solution of benzotriazole (BTA) combined with rinse deionized water to form the protective layer is used.

The plated metal layer may be planarized by electropolishing or CMP. Selection of the planarization method depends on the metal. CMP would also remove the excess barrier metal that is not part of the damascene structure. Typically barrier metals may be tungsten (W), tantalum (Ta) or titanium (Ti).

The bipolar electrodes allow for the use of two separate electroplating solutions, one optimized for plating and used on the anode side of the electrode assembly and one optimized for conducting current to the plated structure on the cathode side without substantially removing the metal. For the preferred embodiment, a single electroplating solution is used for both sides of the electrode assembly. Alternatively, a first electroplating solution for plating may be used on the anode side of the electrode assembly and a second electrolytic solution optimized for conducting without electropolishing may be used on the cathode side.

Adjustments to the process may be made by varying the individual distances of the anode and cathode from the wafer surface, the distances between the electrodes, the effective surface area of the electrodes, the shape of the electrodes, the applied potential, the scanning speed, scanning direction, and the current. The process may be optimized by varying these parameters as a function of the selected chemistries.

Figure 6:
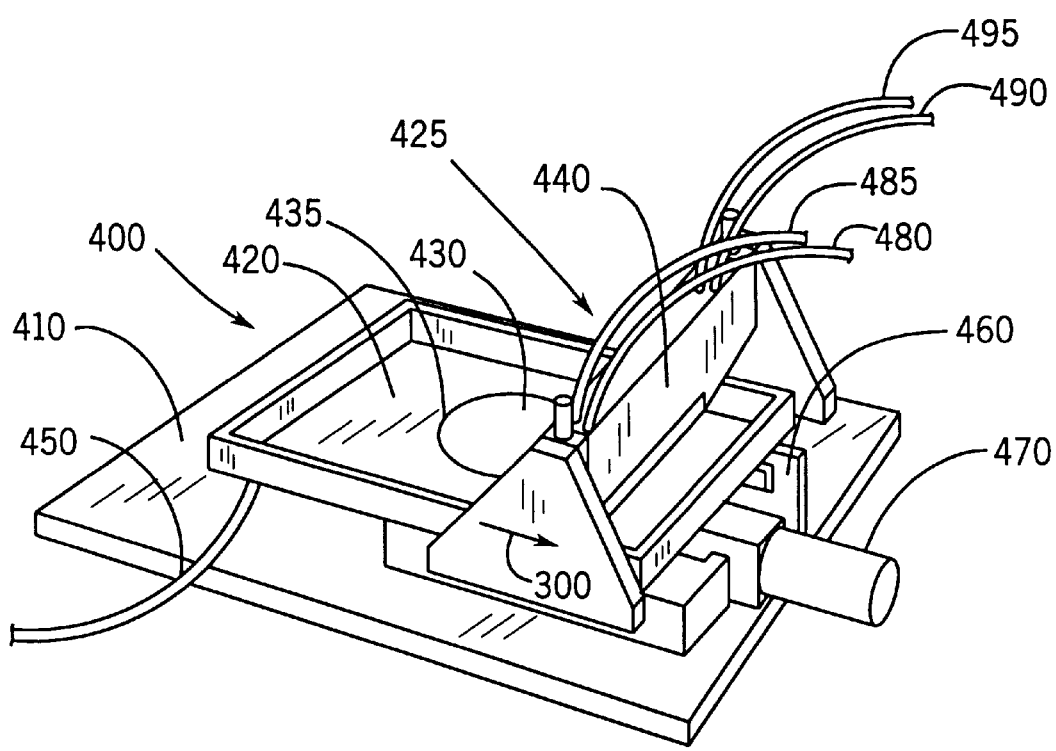
FIG. 6 is a perspective view of the bipolar electrode of the present invention showing a scanning assembly, the electroplating solution container and various power and fluid lines.

Referring to FIG. 6, a perspective view of the electrochemical cell 400 shows a wafer 430 to be processed by being loaded, process side up, into a wafer holding assembly 435 thus allowing access to the metallized layer on the wafer surface. The inner portion of the wafer holding assembly 435 is recessed to allow the wafer surface to be substantially flat with the surface of the remaining part of the holder. The wafer is held in place with a small vacuum chuck (not shown) or with gravity alone. The present implementation of the invention is a system to process 300 mm diameter or smaller semiconductor wafers. There is no practical limiting feature that would prevent the design of a system utilizing the present invention for use with 400 and 500 mm wafers or larger, or with rectangular objects such as flat panel displays. The scanning assembly 425 holding the electrode housing 440 is caused to move over the wafer 430, in the scanning direction 300, by means of the drive motor 470, and scanning table 460 mounted to the baseplate 410. Electroplating solution is fed to the scanning assembly 425 through the fluid input line 490. Spent electroplating solution is withdrawn from the scanning assembly 425 through the fluid withdrawal line 495. The power lines 480 and 485 provide voltage to the scanning assembly 425. The liquid containment 420 prevents unwanted fluid contamination and allows draining of rinse waters, electroplating solution, or surface passivation fluid as needed through fluid line 450. Typically, the wafer is processed in one or more scans of the scanning assembly 425.

Figure 7:
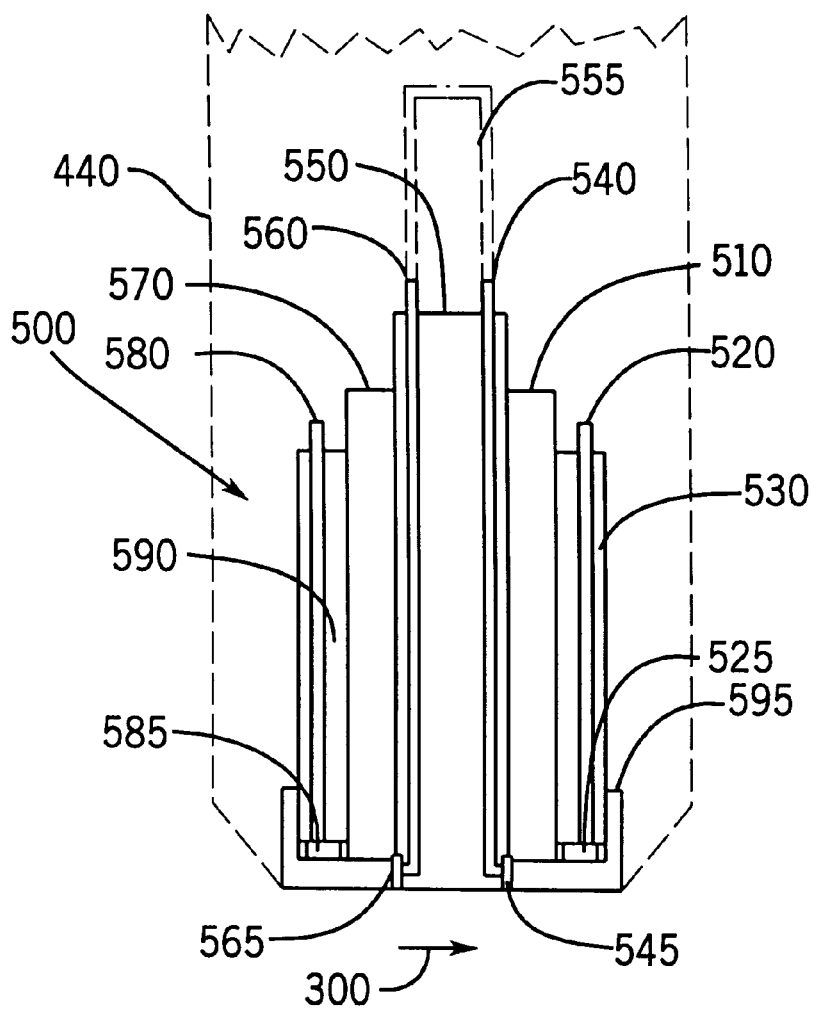
FIG. 7 is an elevational, cross-sectional view of the electrode assembly, showing the anode and cathode, fluid lines, and insulators.

FIG. 7 is an elevational, cross-sectional view of the bipolar electrode assembly 500, within the electrode housing 440, showing the anode 510 and cathode 570. This linear bipolar anode cathode assembly is precisely scanned over the wafer surface, while electroplating solutions are flowed to provide contact between the bipolar anode/cathode assembly and the wafer surface. The anode 510 and cathode 570 operate on the same side of the wafer, not opposite sides as in conventional bipolar plating. The anode and cathode are made preferentially of an inert electrical conductor such as graphite, carbon, platinum, or other metal inert to the electrochemistry. The anode could be made of the metal being plated onto the wafer surface if so desired.

The power lines 480 and 485 shown in FIG. 6 are connected to the anode and cathode, respectively, and provide the operating voltage and current.

Electroplating solution for plating to the wafer surface is provided through the anode-side fluid input line 520, the distribution manifold 525, and brush 595. The brush is typically non-conducting, fibrous or open pore porous, and flexible The brush 595 extends the length and width of the bipolar electrode assembly 500 and is thinner under the insulating separator block 550. It is preferred to have the electrodes slightly recessed with respect to the separator block 550 to enhance the shielding that the block 550 provides to the electric field between the anode and cathode. The anode and cathode may be of a different size, shape, or area to enhance or reduce the current densities under the electrodes and thereby the plating rate.

The brush 595 can be operated in a similar manner as in conventional brush-plating or brush-electropolishing in that it can actually rub the surface that is being plated, or the brush may be operated slightly off of the wafer surface.

The spent electroplating solution for conducting is withdrawn from the wafer surface through the anode-side withdrawal manifold 545 and the fluid withdrawal line 540. The exterior anode insulator block 530 helps to mount the anode 510 and the various other parts of the anode side of the assembly. The anode/cathode separator block 550 provides a mount for the anode and cathode and the fluid lines and forces the current to flow into the metallized wafer surface and not just between the anode and cathode. Electroplating solution for conduction flows between the wafer surface and the cathode through the cathode-side fluid input line 560, distribution manifold 565, and the brush 595. The spent electroplating solution for conduction is withdrawn from the wafer surface through the withdrawal manifold 585 and the cathode-side fluid withdrawal line 580. The exterior cathode insulator block 590 helps to mount the cathode and the various other parts of the cathode side of the assembly. The anode/cathode fluid coupling line 555 is used when the same chemical solution is used to both plate on the anode side and conduct on the cathode side of the assembly. In the preferred embodiment, however, a single electroplating solution is used on both the anode and cathode side.

Referring to FIGS. 6 and 7, as mentioned, the bipolar electrode assembly 500 allows for the use of two separate electroplating solutions, one optimized for plating used in the anode side of the assembly and one optimized for conduction without deplating used on the cathode side. When two such electroplating solutions are used, the electroplating solution for plating flows into the electrode housing 440 through fluid input line 490 and is withdrawn through fluid withdrawal line 495 shown in FIG. 6. Fluid input line 490 connects to anode-side fluid input line 520 and fluid withdrawal line 495 connects to the anode side fluid withdrawal line 540. The electroplating solution for conducting flows into the electrode housing 440 through an additional fluid input line (not shown) and is withdrawn through an additional fluid withdrawal line (also not shown).

Figure 8:
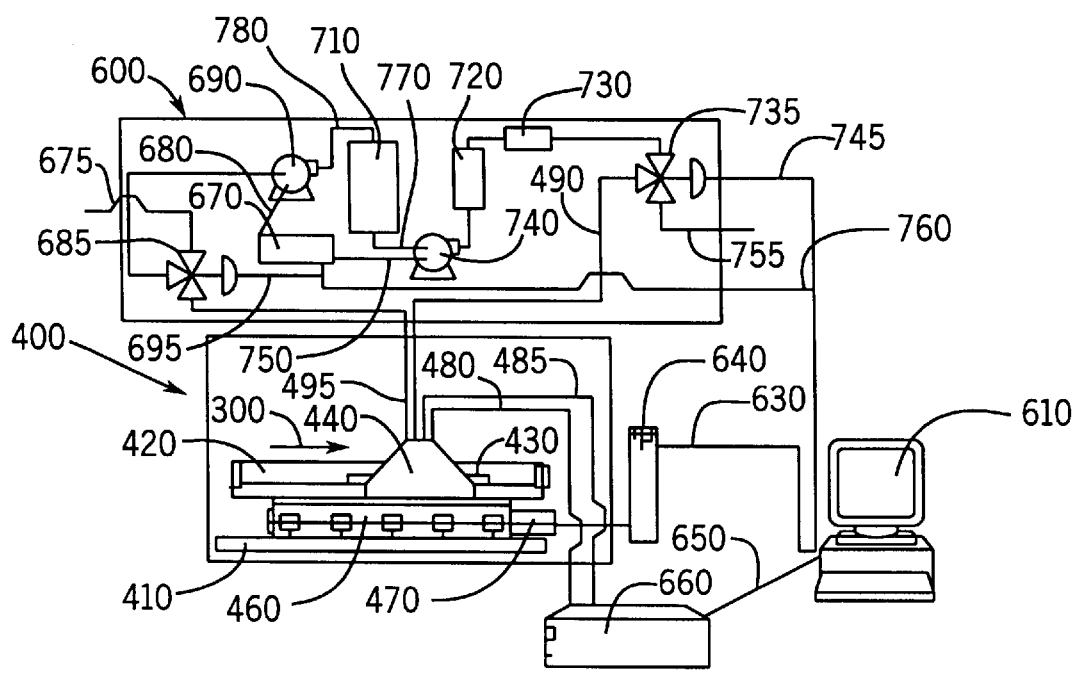
FIG. 8 is a block diagram view of the main parts of the apparatus of the present invention.

Referring to FIG. 8, the main parts of the complete apparatus consisting of the fluid pumping assembly 600, the electrochemical cell 400 as previously described, the electrochemical power unit 660, the control computer 610, and the scan motor controller 640 are shown. For clarity, the fluid pumping assembly 600 is shown only for the electroplating solution for plating. A duplicate of the fluid pumping assembly (not shown) is required for the electroplating solution for conducting if separate solutions are used. In the fluid pumping assembly 600, an electroplating solution is drawn from the feed/return tank 710 through feed line 770 by delivery pump 740 which in turn feeds electroplating solution to the electrode housing 440 through the heat exchanger 720, filter 730, three way valve 735 and fluid input line 490. Spent electroplating solution is withdrawn from the electrode housing 440 through fluid withdrawal line 495 through three way valve 685, by withdrawal pump 690, and delivered through line 780 to the feed/return tank 710. Chemical-B input line 675 is used to initially introduce electroplating solution into the system, top off the system during normal operations, or flush the system with de-ionized water. Chemical-A input line 755 is used to introduce an alternate chemical into the system for additional processing, such as adding a passivator after the plating and planarizing process, or in rinsing the wafer with de-ionized water as is understood in the art. Typically, the alternate chemical is allowed to flow to drain. The process chemicals can be used as a single pass system or can be recirculated with or without replenishment or purification. The replenishment or purification can involve heating, cooling, filtration or chemical modification of the process chemicals as is understood in the art. The control computer 610 communicates (commands and receives data) with the pump motor controller 670, and valves 685 and 735 through control and power lines 760, 695 and 745, respectively. The pump motor controller 670 controls pumps 690 and 740 through control and power lines 680 and 750, respectively.

Because the electroplating solution for plating may be different from the electroplating solution for conducting, two fluid pumping assemblies 600 may be required and additional fluid lines would be added. Control of the additional pumping assembly would be hooked up in a similar manner as the single unit shown in FIG. 8.

Additional chemical lines and chemicals may be added to the electrode assembly to provide for a chemical treatment between plating and electropolishing, before plating to condition the surface for plating, or after electropolishing to add a passivation layer. The additional steps may be added to the process through the use of multiple electrodes within the electrode assembly, with the anode and cathode alternating, so that the process may be accomplished in a single pass of the assembly. Separate assemblies, each with specific processes, may be caused to pass over the wafer to accomplish the same.

The electrode assembly has been described moving with the wafer fixed. The current invention allows the electrode assembly to be fixed with the wafer moving, or with both moving relative to each other.

In addition, while the orientation of the assembly is shown with the active side of the workpiece upwards with respect to gravity, the invention would work also in any orientation with respect to gravity. The invention has been described in terms of linear electrodes and relative linear motion between the electrode assembly and workpiece, one skilled in the art can realize that changing the shapes of the electrodes and changing the type of relative motion may also be practiced by this invention. Thus circular or orbital relative motions, combinations of relative motions, combination of relative motions and various electrode shapes may be practiced by this invention. Orbital motion, as used herein, refers to movement of an object in an orbit without angular rotation about a center. Circular motion, as used herein, refers to angular rotation of an object about a center. Combined motions may be achieved by moving the wafer with one motion and the electrodes with another motion or by moving either the wafer or electrodes with multiple alternating or simultaneous motions. A typical combination motion might be a linear tangential sweeping of the electrodes across the wafer as the wafer is moved with circular motion like a record or CD. During retrograde motion between the electrode and the wafer opposite the scanning direction, the voltage across the anode and cathode may be switched off or reversed in polarity. The invention has also been described in terms of a single anode and cathode, however, the invention may be practiced with multiple alternating anode and cathode electrodes in a single electrode assembly, each of the same or different area and/or shape or may be practiced with multiple electrode assemblies, each configured to provide for desired results as one skilled in the art may realize.

Table 1 and 2 list electroplating solutions for plating for use on the anode side while Table 3 lists an electroplating solution for conducting that could be used on the cathode side. For the preferred embodiment, a single electroplating solution of Table 1 or 2 is used for both the anode and cathode side.

TABLE 1

|  | Low | High | Preferred |
|---|---|---|---|
| Copper Sulfamate | 50 g/L | 150 g/L | 100 g/L |
| Ammonium Sulfamate | 100 g/L | 150 g/L | 125 g/L |
| Sulfamic Acid | 20 g/L | 30 g/L | 25 g/L |
| Chloride ions | 50 ppm | 100 ppm | 75 ppm |
| Dextrose | 0 g/L | 10 g/L | 8 g/L |
| Triethanolamine | 0 g/L | 6 g/L | 3 g/L |
| pH | 1 | 3.5 | 2 (adj. with sulfamic acid) |
| Current Density | 2 A/m2 | 37 A/m2 | 10 A/m2 |

TABLE 2

|  | Low | High | Preferred |
|---|---|---|---|
| Copper fluoborate | 200 g/L | 500 g/L | 300 g/L |
| Fluoboric acid | 5 g/L | 60 g/L | 25 g/L |
| pH | 0.2 | 2 | 1 (adj with fluoboric acid) |
| Current Density | 5 A/m2 | 40 A/m2 | 15 A/m2 |

Table 3 lists a conducting electroplating solution that can be used with either of the above solutions (Table 1 & 2) when a separate conducting and electroplating solution is desired.

TABLE 3

| Phosphoric Acid | * adj. pH to match plating fluid pH by changing concentration and by using ammonia hydroxide. |
|---|---|

When plating wafers, the system is operated in a programmed current mode, the current directly proportional to the area of the wafer under the scanning assembly. The computer control system controls the current to the scanning electrode as a function of the location of the scanning assembly on the wafer. Depending on the width of the widest trench to be filled, the effective electropolishing current density is between 2 to 50 amps per square foot (ASF) and the preferred scanning speed is between 4 and 8 inches per minute. One of ordinary skilled in electroplating can readily further optimize the operation of the present invention by selecting alternate chemistries, and varying the current, and scan speed.

Our present implementation of the invention is a system to process 300 mm diameter or smaller semiconductor wafers. There is no practical limiting feature that would prevent the design of a system utilizing the present invention for use with 400 or 500 mm wafers or larger, or with rectangular objects such as flat panel displays. In addition, our current invention could easily utilize the same process on any material that had a conductive seed layer and feature trenches and vias, such as decorative damascene inlays, damascene structures used in printed wiring circuit boards, or in forming separate interconnect structures that are later added to semiconductor devices or printed circuit wiring boards. Metals, compounds, and alloys that can be electroplated in an aqueous or non-aqueous solution are compatible with this process, such as copper, aluminum, silver, nickel, cobalt, gold, chromium, Sn/Ni, NiWP, CoWP, Cu/Zn, or other such materials of economic value including: Fe, Zn, Cd, Pd, Pt, Sn, and Bi.

The above description has been that of a preferred embodiment of the present invention. It will occur to those that practice the art that many modifications may be made without departing from the spirit and scope of the invention. In order to apprise the public of the various embodiments that may fall within the scope of the invention the following claims are made.

We claim:

1. A method of bipolar metal plating of a metallized surface of a semiconductor wafer, the method including the steps of:
    (a) positioning a bipolar electrode assembly proximate to said metallized surface, said bipolar electrode assembly having an anode and cathode separated along an axis parallel to said metallized surface;
    (b) bathing a region between said anode and said cathode and said metallized surface in an electroplating solution; and
    (c) providing relative motion between said bipolar electrode assembly and said metallized surface, said relative motion being parallel to said metallized surface; and
    (d) applying a voltage across said anode and said cathode to plate metal from said electroplating solution onto a first region of said metallized surface; said first region being adjacent to said anode; and to conduct current from a second region of said metallized surface; said second region being adjacent to said cathode; through the action of flowing current from said anode through said electroplating solution to said first region of said metallized surface, flowing said current through said metallized surface to said second region, and flowing said current to said cathode through said electroplating solution.

2. The method according to claim 1, wherein said relative motion is provided by holding said metallized surface stationary and moving said bipolar electrode assembly.

3. The method according to claim 1, wherein said relative motion is provided by holding said bipolar electrode assembly stationary and moving said metallized surface.

4. The method according to claim 1, wherein said relative motion is provided by moving both said metallized surface and said bipolar electrode assembly.

5. The method according to claim 1, wherein said relative motion is chosen from the group consisting of: linear motion, orbital motion, circular motion; or a combination of linear, orbital, and circular motions.

6. The method according to claim 1, wherein the step of bathing a region between said anode and said cathode and said metallized surface in an electroplating solution is performed via separate supply lines providing different electroplating solutions proximate the anode and cathode.

7. The method according to claim 1, including the step of positioning a brush between said bipolar electrode assembly and said metallized surface, with a surface of said brush adjacent to said metallized surface.

8. The method according to claim 1, wherein said voltage across said anode and said cathode is controlled in accordance with a direction of said relative motion.

9. The method according to claim 1, wherein said flowing current is controlled in accordance with a direction of said relative motion.

10. The method according to claim 1, including the step of supporting said metallized surface from the side opposite said metallized surface.

11. The method of claim 1 wherein the metal for plating is selected from a group consisting of: Cu, Au, Ag, Co, Fe, Al, Zn, Cd, Cr, Ni, Pd, Pt, Sn, and Bi.

12. The method according to claim 1, including the step of reusing said electroplating solution by recirculation means and conditioning means.

13. The method according to claim 12, wherein said conditioning means is selected from the group consisting of: heating means, cooling means, chemical modification means, and means for filtration of said electroplating solution.

14. A method of bipolar metal plating of a metallized surface, the method including the steps of:
    (a) positioning a bipolar electrode assembly proximate to said metallized, said bipolar electrode assembly having an anode and cathode separated along an axis parallel to said metallized surface;
    (b) bathing a region between said anode and said cathode and said metallized surface in an electroplating solution; and
    (c) providing relative motion between said bipolar electrode assembly and said metallized surface, said relative motion being parallel to said metallized surface; and
    (d) applying a voltage across said anode and said cathode to plate metal from said electroplating solution onto a first region of said metallized surface; said first region being adjacent to said anode; and to conduct current from a second region of said metallized surface; said second region being adjacent to said cathode; through the action of flowing current from said anode through said electroplating solution to said first region of said metallized surface, flowing said current through said metallized surface to said second region, and flowing said current to said cathode through said electroplating solution.

15. The method according to claim 14, wherein said relative motion is provided by holding said metallized surface stationary and moving said bipolar electrode assembly.

16. The method according to claim 14, wherein said relative motion is provided by holding said bipolar electrode assembly stationary and moving said metallized surface.

17. The method according to claim 14, wherein said relative motion is provided by moving both said metallized surface and said bipolar electrode assembly.

18. The method according to claim 14, wherein said relative motion is chosen from the group consisting of: linear motion, orbital motion, circular motion, or a combination of linear, orbital, and circular motions.

19. The method according to claim 14, wherein the step of bathing a region between said anode and said cathode and said metallized surface in an electroplating solution is performed via separate supply lines providing different electroplating solutions proximate the anode and cathode.

20. The method according to claim 14, including the step of positioning a brush between said bipolar electrode assembly and said metallized surface with a surface of said brush adjacent to said metallized surface.

21. The method according to claim 14, wherein said voltage across said anode and said cathode is controlled by means in accordance with a direction of said relative motion.

22. The method according to claim 14, wherein said flowing current is controlled by means in accordance with a direction of said relative motion.

23. The method according to claim 14, including the step of supporting said metallized surface from the side opposite said metallized surface.

24. The method according to claim 14, including the step of reusing said electroplating solution by recirculation means and conditioning means.

25. The method according to claim 24, wherein said conditioning means is selected from the group consisting of: heating means, cooling means, chemical modification means, and means for filtration of said electroplating solution.

26. The method of claim 14 wherein the metal for plating is selected from a group consisting of: Cu, Au, Ag, Co, Fe, Al, Zn, Cd, Cr, Ni, Pd, Pt, Sn, and Bi.

* * * * *

UNITED STATES PATENT AND TRADEMARK OFFICE
CERTIFICATE OF CORRECTION

PATENT NO : 6,132,586
DATED : October 17, 2000
INVENTOR(S) : John A. Adams et al.

It is certified that error appears in the above-identified patent and that said Letters Patent is hereby corrected as shown below:

Claim 5, line 3, "motion; or combination" should read -- motion, or combination --.

Signed and Sealed this

Eighth Day of May, 2001

NICHOLAS P. GODICI

*Attest:*

*Attesting Officer*    *Acting Director of the United States Patent and Trademark Office*

UNITED STATES PATENT AND TRADEMARK OFFICE
CERTIFICATE OF CORRECTION

PATENT NO. : 6,132,586
DATED : October 17, 2000
INVENTOR(S) : John A. Adams et al.

Page 1 of 1

It is certified that error appears in the above-identified patent and that said Letters Patent is hereby corrected as shown below:

Column 3, line 8, "c4" should be --$C_4$--.

Column 3, line 29, "08/587,264" should be --08/587,263--

Signed and Sealed this

Twelfth Day of June, 2001

*Attest:*

*Attesting Officer*

NICHOLAS P. GODICI
*Acting Director of the United States Patent and Trademark Office*